(12) United States Patent
Laursen et al.

(10) Patent No.: US 6,923,711 B2
(45) Date of Patent: Aug. 2, 2005

(54) MULTIZONE CARRIER WITH PROCESS MONITORING SYSTEM FOR CHEMICAL-MECHANICAL PLANARIZATION TOOL

(75) Inventors: Thomas Laursen, Phoenix, AZ (US); Daniel Trojan, Phoenix, AZ (US)

(73) Assignee: Speedfam-IPEC Corporation, Chandler, AZ (US)

( * ) Notice: Subject to any disclaimer, the term of this patent is extended or adjusted under 35 U.S.C. 154(b) by 264 days.

(21) Appl. No.: 09/970,185

(22) Filed: Oct. 3, 2001

(65) Prior Publication Data

US 2002/0098777 A1 Jul. 25, 2002

Related U.S. Application Data

(63) Continuation-in-part of application No. 09/690,521, filed on Oct. 17, 2000.

(51) Int. Cl.[7] .............................................. B24B 49/12
(52) U.S. Cl. .......................................... 451/6; 451/288
(58) Field of Search ........................ 451/41, 6, 8, 24, 451/288, 287, 53

(56) References Cited

U.S. PATENT DOCUMENTS

| | | | |
|---|---|---|---|
| 5,067,282 A | 11/1991 | Netzel | |
| 5,498,196 A | 3/1996 | Karlsrud et al. | |
| 5,554,064 A | 9/1996 | Breivogel et al. | |
| 5,559,428 A | 9/1996 | Li et al. | |
| 5,582,534 A | 12/1996 | Shendon et al. | |
| 5,644,221 A | 7/1997 | Li et al. | |
| 5,660,672 A | 8/1997 | Li et al. | |
| 5,692,947 A | 12/1997 | Talieh et al. | |
| 5,700,180 A | * 12/1997 | Sandhu et al. ................. | 451/5 |
| 5,707,274 A | 1/1998 | Kim et al. | |
| 5,882,243 A | 3/1999 | Das et al. | |
| 5,916,016 A | 6/1999 | Bothra | |
| 5,938,884 A | 8/1999 | Hoshizaki et al. | |
| 5,941,758 A | 8/1999 | Mack | |
| 5,964,653 A | 10/1999 | Perlov et al. | |
| 6,056,632 A | 5/2000 | Mitchel et al. | |
| 6,095,904 A | 8/2000 | Breivogel et al. | |
| 6,106,378 A | 8/2000 | Perlov et al. | |
| 6,159,073 A | 12/2000 | Wiswesser et al. | |
| 6,190,234 B1 | * 2/2001 | Swedek et al. ................. | 451/6 |
| 2001/0001755 A1 | 5/2001 | Sandhu et al. | |

FOREIGN PATENT DOCUMENTS

| | | |
|---|---|---|
| WO | WO 00/26609 | 5/2000 |
| WO | WO 02/33737 A2 | 4/2002 |

* cited by examiner

*Primary Examiner*—Robert A. Rose
(74) *Attorney, Agent, or Firm*—Ingrassia Fisher & Lorenz PC (57) ABSTRACT

The invention improves a polishing process for a wafer retained in a multizone carrier in a chemical mechanical polishing tool. A light signal is communicated to the front surface of the wafer and the reflected light signal is captured by a metrology instrument. The metrology instrument communicates the intensity of the reflected light to a control system. The location or radial position corresponding to the reflected light signal from the front surface of the wafer may be determined by the control system. From the intensity measurements and corresponding locations, the control system is able to determine an approximate topography of the wafer. The control system may alter the pressure within one or more zones within the multizone carrier to improve the polishing process. The control system may also alter the initial pressures within the multizone carrier for future wafers based on the polishing results from the present wafer.

22 Claims, 7 Drawing Sheets

MULTIZONE CARRIER WITH PROCESS MONITORING SYSTEM FOR CHEMICAL-MECHANICAL PLANARIZATION TOOL

CROSS-REFERENCES TO RELATED APPLICATIONS

This application is a continuation in part of U.S. Ser. No. 09/690,521 filed on Oct. 17, 2000, and of common assignee.

TECHNICAL FIELD

The present invention relates generally to semiconductor manufacturing, and more specifically to monitoring in situ a planarization process of a wafer and adjusting the pressure in one or more zones of a multizone carrier to improve the planarization process.

BACKGROUND OF THE INVENTION

A flat disk or "wafer" of single crystal silicon is the basic substrate material in the semiconductor industry for the manufacture of integrated circuits. Semiconductor wafers are typically created by growing an elongated cylinder or boule of single crystal silicon and then slicing individual wafers from the cylinder. The slicing causes both faces of the wafer to be extremely rough. The front face of the wafer on which integrated circuitry is to be constructed must be extremely flat in order to facilitate reliable semiconductor junctions with subsequent layers of material applied to the wafer. Also, the material layers (deposited thin film layers usually made of metals for conductors or oxides for insulators) applied to the wafer while building interconnects for the integrated circuitry must also be made a uniform thickness.

Figure 1:
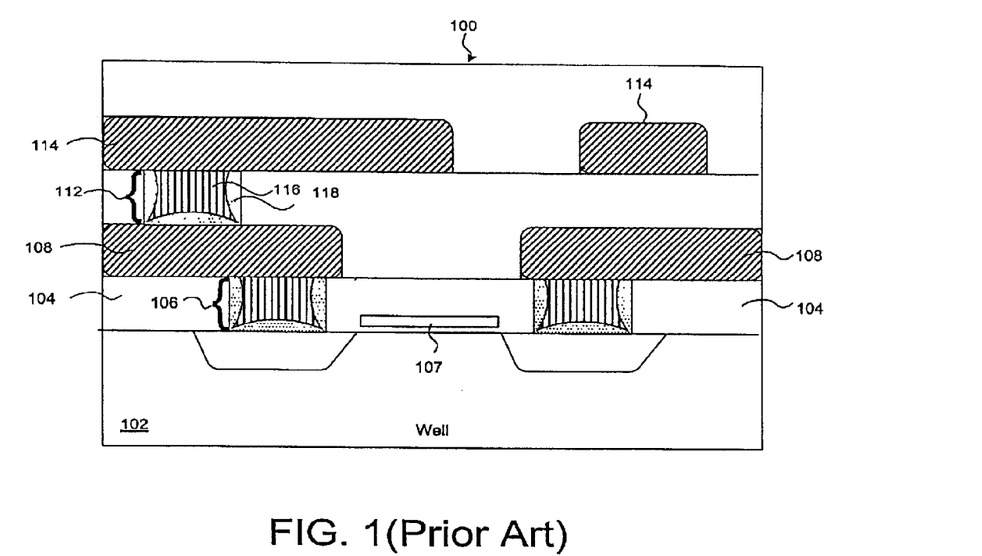
FIG. 1 is a greatly expanded cross section view of a semiconductor chip.

Integrated circuits manufactured today are made up of literally millions of active devices such as transistors and capacitors formed in a semiconductor substrate. Integrated circuits rely upon an elaborate system of metalization in order to connect the active devices into functional circuits. A typical multilevel interconnect 100 is shown in FIG. 1. Active devices such as MOS transistors 107 are formed in and on a silicon substrate or well 102. An interlayer dielectric (ILD) 104, such as $SiO_2$, is formed over silicon substrate 102. ILD 104 is used to electrically isolate a first level of metalization that is typically aluminum (Al), with copper (Cu) increasing in popularity, from the active devices formed in substrate 102. Metalized contacts 106 electrically couple active devices formed in substrate 102 to interconnections 108 of the first level of metalization. In a similar manner metal vias 112 electrically couple interconnections 114 of a second level of metalization to interconnections 108 of the first level of metalization. Contacts 106 and vias 112 typically comprise a metal 116 such as tungsten (W) surrounded by a barrier metal 118 such as titanium-nitride (TiN). Additional ILD/contact and metalization layers may be stacked one upon the other to achieve the desired interconnections. The ILD/contact and metalization layers may be formed, for example, using a dual damascene process.

Planarization is the process of removing projections and other imperfections to create a flat planar surface, both locally and globally, and/or the removal of material to create a uniform thickness for a deposited thin film layer on a wafer. Semiconductor wafers are planarized or polished to achieve a substantially smooth, flat finish before performing process steps that create the integrated circuitry or interconnects on the wafer. A considerable amount of effort in the manufacturing of modem complex, high density multilevel interconnects is devoted to the planarization of the individual layers of the interconnect structure. Nonplanar surfaces create poor optical resolution of subsequent photolithography processing steps. Poor optical resolution prohibits the printing of high-density lines. Another problem with nonplanar surface topography is the step coverage of subsequent metalization layers. If a step height is too large there is a serious danger that open circuits will be created. Planar surface layers are required in the fabrication of modem high-density integrated circuits. To this end, chemical-mechanical planarization (CMP) tools have been developed to provide controlled planarization of both structured and unstructured wafers.

CMP consists of a chemical process and a mechanical process acting together, for example, to reduce height variations across a dielectric region, clear metal deposits in damascene processes or remove excess oxide in shallow trench isolation fabrication. The chemical-mechanical process is achieved with a liquid medium containing chemicals that react with the front surface of the wafer when it is mechanically stressed during the planarization process.

In a conventional CMP tool for planarizing a wafer, a wafer is secured in a carrier connected to a shaft. The shaft is typically connected to mechanical means for transporting the wafer between a load or unload station and a position adjacent to a polishing pad mounted to a rigid or flexible platen or supporting surface. Pressure is exerted on the back surface of the wafer by the carrier in order to press the front surface of the wafer against the polishing pad, usually in the presence of slurry. The wafer and/or polishing pad are then moved in relation to each other via motor(s) connected to the shaft and/or,supporting surface in order to remove material in a planar manner from the front surface of the wafer.

It is often desirable to monitor the front surface of the wafer during the planarization process. One known method is to use an optical system that monitors the front surface of the wafer in situ by positioning an optical probe under the polishing pad. Laser interferometry, signal template matching and multifrequency analysis techniques, as well as others, are known monitoring methods. The signal from the probe may be transmitted and received through an opening in the polishing pad. The opening in the polishing pad may be filled with an optically transparent material, or "window", in order to prevent polishing slurry or other contaminants from being deposited into the probe and obscuring the optical path to the wafer. The data from the optical system is typically analyzed by a control system to determine the current condition of the front surface of the wafer. It is possible to terminate the planarization process (call endpoint) once the front surface of the wafer has reached a desired condition. An optical system may be used to compensate for drifts in the planarization process, variability in the associated consumables (polishing pads and slurries), and variability in the thickness of incoming wafers.

Figure 2:
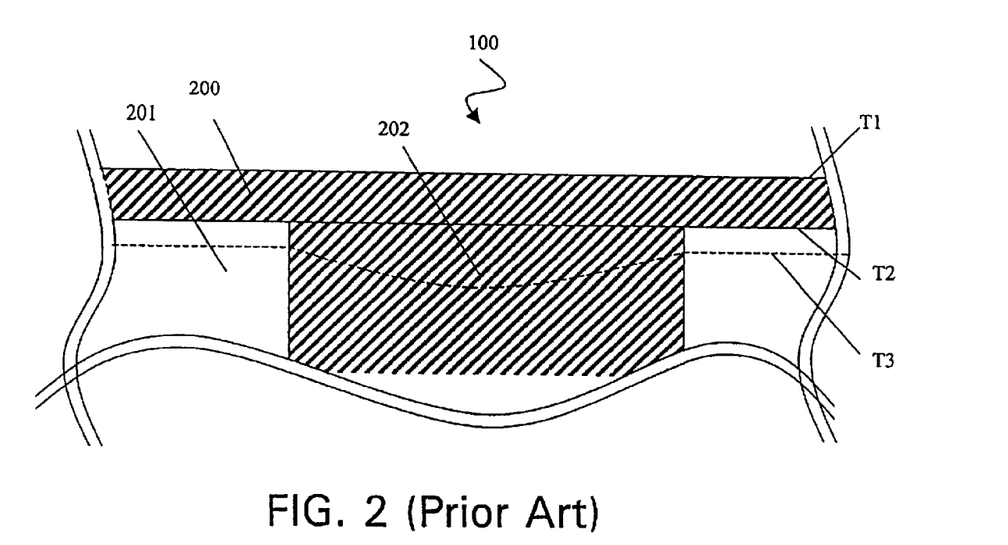
FIG. 2 is a greatly expanded cross section view of an interconnect in a semiconductor chip.

A reliable end-point detection system is critical for maintaining an optimum CMP process. The end-point system detects the point in the planarization process when the overburden being polished is removed everywhere across the wafer. Excessive removal of overburden from the front surface of the wafer, whether a raw sheet film, or an STI, metal or dielectric layer structure on the front wafer surface, may damage the wafer. CMP of copper will become one of the most common and critical planarization processes when the copper interconnect technology starts to dominate the fabrication of integrated circuits. FIG. 2 illustrates some of the potential problems if excessive overburden is removed, in this case copper, from the front surface of a wafer. At time T1 a layer of deposited copper 200 remains on the wafer. The CMP planarization process should terminate at time T2 or just slightly thereafter for an optimum planarized surface. However, if the planarization process is not terminated quickly enough, excessive removal of copper in the interconnects 202 may occur as shown at time T3. The dishing of the copper interconnects 202 occurs since the copper is softer than the silicon dioxide 201 and is therefore removed at a faster rate.

End-point detection and monitoring is required for copper CMP due to the variations in the incoming thickness distribution of the copper film as well as microstructural variations in the deposited copper film. These result in nonuniform clearing of the copper across the front surface of the wafer. Several problems exist with conventional in situ monitoring techniques that limit their ability to accurately detect the clearing of the copper.

In addition, some conventional systems tend to measure a relatively large spot, or integrate a number of large spots (smear measurement), on the wafer's surface to increase the surface area of the wafer being monitored. However, these measurements create a system with very poor sensitivity that cannot distinguish high metalization density from mere residual metal. Improved sensitivity is required to detect residuals on the wafer's surface that are on the order of the spot size, but may influence the quality of the planarization process.

Applicants also noticed a further problem with some conventional monitoring systems in that they do not associate a measurement with the location on the wafer where the measurement was taken. This prevents in situ corrections to the planarization process based on information related to particular areas of the wafer.

Another problem Applicants noticed was that some conventional monitoring systems do not take measurements in fine enough increments along a radial line leaving concentric bands between measurements unmonitored. Problems in the planarization process typically manifest themselves as bands that are either being polished too quickly or too slowly. Conventional monitoring systems are not able to detect problem bands that lie totally within unmeasured bands (blind spots). This creates the very undesirable condition of having potential problem areas that are not detectable.

What is needed is a system for monitoring the front surface of a wafer during a planarization process that is able to take frequent measurements with one or more probes, has a small spot size for higher sensitivity in detecting small residuals, has the ability to associate a measurement with its location on the wafer, takes measurements at various points on the surface of the wafer in a time period critical to and relevant to the particular process, and can determine areas on the wafer that need an increased or decreased material removal rate.

SUMMARY OF THE INVENTION

The present invention is an apparatus and method for planarizing a front surface of a wafer. The front surface of the wafer is planarized by pressing the front surface of the wafer against a polishing surface mounted on a platen. Relative motion is created between the polishing surface and the wafer by a motion generator operably coupled to the platen. The relative motion may be comprised of rotational, orbital, linear or other types of motion.

The wafer is preferably supported on a membrane in a multizone carrier during the planarization process. The multizone carrier may have a plurality of independently controllable pressure plenums behind the membrane. A pump and pressure regulators may be used to control the pressure within one or more of the plenums. The pressing force on the back surface of the wafer may be controlled by controlling the pressure within each of the plenums. Increasing the pressure within a particular plenum will increase the down force on the back surface of the wafer opposite the plenum. The increased down force will increase the removal rate of material on the front surface of the wafer opposite the plenum. The multizone carrier may thus be used to adjust the removal rate of material from the front surface of the wafer during the planarization process. The wafer may also be rotated or oscillated within the carrier by various motors attached to the carrier.

One or more probes may be used to monitor the polishing process of the front surface of the wafer. The probes may be temperature or eddy current probes, but are preferably optical probes.

When optical probes are used, a light source may be mounted external to the platen, but is preferably mounted in the platen. Mounting the light source in the platen simplifies the cabling necessary to direct a light signal towards the front surface of the wafer. A detector may also be mounted in the platen to receive the reflected light signal. In a preferred embodiment, a laser light source and detector comprise an interferometer to take measurements on the front surface of the wafer. Additional interferometers may be used if desired. A control system, such as one or more computers, may receive and analyze the data from the detector or interferometer.

In operation, a light signal may be transmitted to the front surface of the wafer. A window may be positioned in the polishing surface to allow the light signal to be communicated to and from the front surface of the wafer. The reflected light signal from the front surface of the wafer may be detected by a metrology instrument.

If the metrology instrument comprises a grating spectrometer, the light signal is preferably a multifrequency signal having a small spot size to increase the sensitivity of the system. The spectrometer converts the light signal into data representing the intensity of the reflected light at various wavelengths. If the metrology instrument comprises an interferometer, the light signal may be a laser beam that may be integrated over a larger area. The interferometer converts the light signal into an intensity measurement.

The intensity measurement(s) of the reflected light signal from the metrology instrument may be communicated to a control system. The control system may analyze the intensity measurement(s) from the metrology instrument to derive one or more characteristics of the front surface of the wafer. The characteristics may be, for example, the remaining thickness, polishing rate, or amount removed on the front surface of the wafer.

The control system may also correlate these characteristics with a particular location, or a particular radial location, on the front surface of the wafer. The control system may gather data from other parts of the CMP tool to determine the location of each measurement on the front surface of the wafer. For example, the location of the measurement on the wafer may be found by using encoders on the carrier and the supporting surface. Another example is to use computer modeling of the various motions of the CMP tool to determine the probes location in relation to the wafer at any given time. As another example, the position of the retaining ring may be determined from the measurements taken thus allowing the position of other measurements to be calculated based on the known position of the retaining ring.

From the characteristics and corresponding location or radial location, the control system may determine one or more characteristics regarding the front surface of the wafer. For example, the topography, uniformity or thin film thickness may be determined for wafers having a deposited oxide film or the areas still covered by a metal may be determined for wafers having a deposited metal film. The control system may then adjust the pressures in one or more zones within the multizone carrier to improve the resulting local and/or global uniformity of the front surface of the wafer from the polishing process. In general, the pressure may be increased within zones corresponding to areas where increased material removal is desired while the pressure may be decreased within zones corresponding to areas where decreased material removal is desired.

The process of measuring one or more characteristics of the front surface of the wafer and adjusting the pressure within one or more zones of a multizone carrier may be repeated until an end point condition has been detected. In addition, the control system may adjust the initial pressure within each zone for subsequent wafers based on the polishing process of the present wafer.

BRIEF DESCRIPTION OF THE DRAWINGS

The present invention will hereinafter be described in conjunction with the appended drawing figures, wherein like numerals denote like elements, and.

DETAILED DESCRIPTION OF EXEMPLARY EMBODIMENTS

An improved polishing apparatus and method utilized in the polishing of semiconductor wafers and thin films formed thereon will now be described. In the following description, numerous specific details are set forth illustrating Applicant's best mode for practicing the present invention and enabling one of ordinary skill in the art to make and use the present invention. It will be known, however, to one skilled in the art that the present invention may be practiced without these specific details. In other instances, well-known machines and process steps have not been described in particular detail in order to avoid unnecessarily obscuring the present invention.

An apparatus for practicing the present invention will now be discussed with reference to FIG. 3. During a planarization process, a wafer 100 may be transported by a carrier 301 to a position adjacent and substantially parallel to a working surface or polishing pad 309. The front surface of the wafer 100 is pressed against the polishing pad 309 fixed to a supporting surface 211, preferably in the presence of a slurry (not shown). The front surface of the wafer 100 is planarized by generating relative motion between the front surface of the wafer 100 and the polishing pad 309 thereby removing material from the front surface of the wafer 100.

The invention may include one or more probes 305a–c positioned at any desired location beneath the polishing pad 309. Temperature probes may be used to sense a change in temperature on the front surface of the wafer which correspond to changes in the thickness of the film on the wafer. Eddy current probes may induce a current in the thin film and as the thickness of the film changes (either increase or decrease) the changes in the current may be detected. With a conductive film, eddy currents may be induced in the film by generating an alternating electromagnetic field with a sensor which may include a capacitor and an inductor. Eddy current probes and their use are described in U.S. Pat. No. 5,559,428; U.S. Pat. No. 5,660,672; and U.S. Pat. No. 5,644,221 which are all hereby incorporated by reference.

In the preferred embodiment, the probes are optical probes. Optical probes transmit light to, and receive reflected light from, the front surface of the wafer 100. Three probes 305a–c are illustrated in FIG. 3, however, any number of probes may be used. The greater the number of probes, the faster a complete scan of the wafer may generally be taken, but each additional probe increases the expense and complexity of the system. The probes 305a–c may be bifurcated to allow separate optical paths for the transmitted and reflected light. A light source 317 creates the light signal and a spectrometer 318 may be used to assist in analyzing the reflected light. Each probe 305a–c may be positioned to transmit light to, and receive reflected light from, a particular annular band on the front surface of the wafer 100. If an orbital CMP tool is used having a relatively small orbital radius, each probe 305a–c may be used to monitor a single annular band. The annular bands in such an orbital CMP tool may be made to overlap to insure the entire front surface of the wafer 100 is being monitored.

Figure 7:
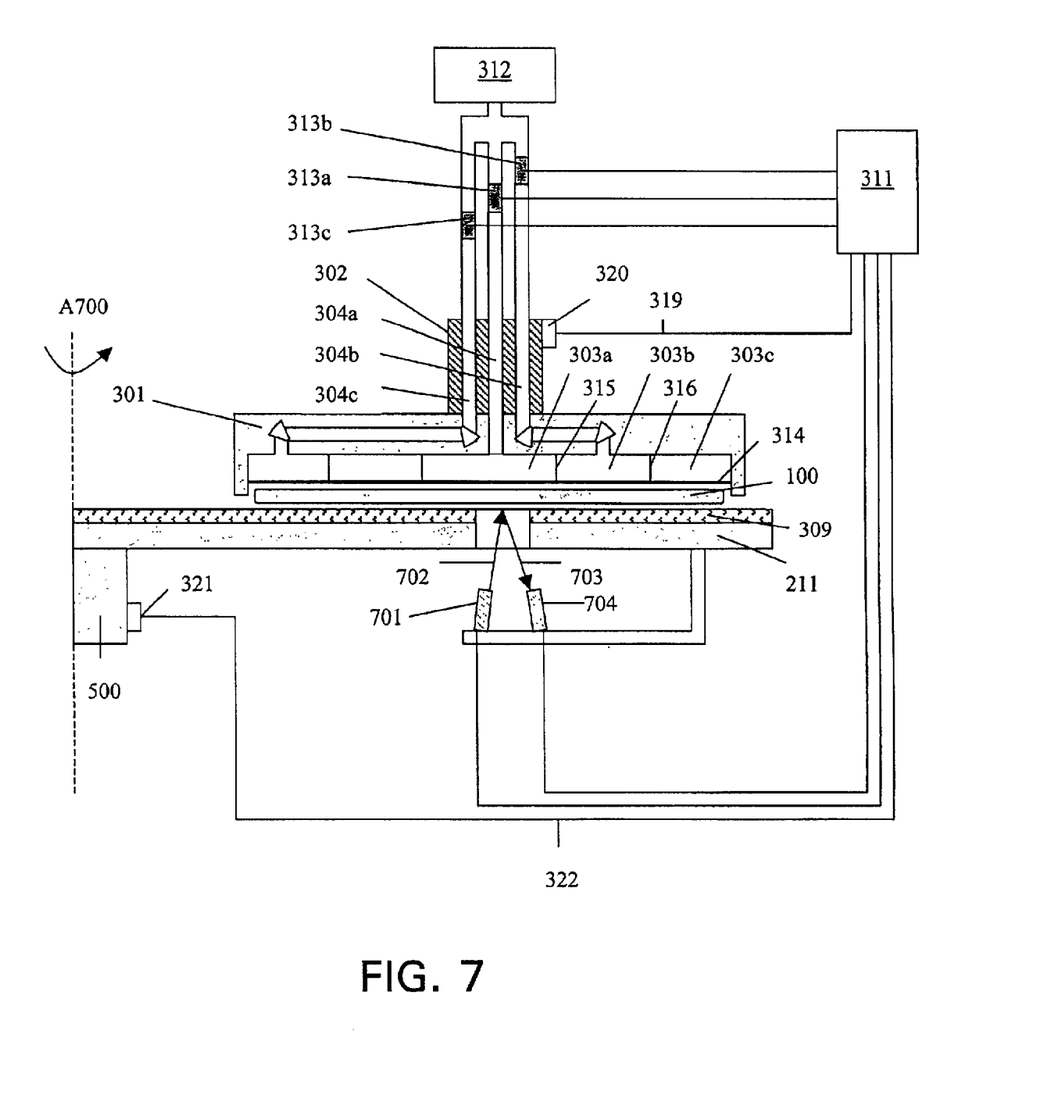
FIG. 7 is a simplified cross section view of an apparatus used to practice the present invention.

FIG. 7 illustrates another embodiment of the invention. This embodiment may include one or more lasers 701 positioned beneath the polishing pad 309 to transmit a laser beam 702 through a hole or window to the front surface of the wafer 100. An interferometer 704 may be positioned to receive the reflected laser beam 703. One laser 701 and one interferometer 704 are illustrated in FIG. 7, but any number of lasers and interferometers may be used. The greater the number of lasers and interferometers, the faster a complete scan of the front surface of the wafer may generally be taken, but each additional laser and interferometer increases the expense and complexity of the system. The laser(s) and interferometer(s) may be used in a manner similar to the probes 305a–c illustrated in FIG. 3.

Analysis of the reflected light may then be used to alter the planarization process. For example, a planarization process parameter may be adjusted or the pressure exerted on the back surface of the wafer 100 may be altered by a multizone carrier 301.

The carrier 301 is preferably rotated about its central axis as it presses the front surface of the wafer 100 against the polishing pad 309 during the planarization process. The rotational speed of the carrier 301 is preferably selected to optimize the planarization process. The optimum rotational speed for the planarization process may be determined through computer models or by empirical means. Rotational speeds of about 12 rpm for the carrier 301 have been found to produce satisfactory planarization results while permitting the transmittance and reception of reflected light from the front surface of the wafer 100. The carrier 301 may also be moved along the polishing pad 309 to enhance the planarization process of the wafer 100.

The carrier 301 may be adapted to permit biasing the pressure exerted on different areas of the back surface of the wafer 100. Areas on the back surface of the wafer 100 receiving a higher (or lower) pressure will typically increase (or decrease) the removal rate of material from corresponding areas on the front surface of the wafer 100. Removal rates of material from planarization processes are typically substantially uniform within concentric annular bands about the center of the wafer, but often differ greatly from band to band. To correct for this common problem, the carrier 301 is preferably capable of exerting different pressures in a plurality of different areas while maintaining a uniform pressure within each area. Since removal rates for planarization processes tend to be uniform within concentric bands on the front surface of the wafer 100, the carrier 301 is ideally able to apply a uniform pressure over each concentric band on the back surface of the wafer 100. In addition, since removal rates tend to differ from band to band on the front surface of the wafer 100, the carrier 301 is also ideally able to apply different pressures over different bands on the back surface of the wafer 100. Examples of such carriers are disclosed in U.S. Pat. No. 5,882,243; U.S. Pat. No. 5,916,016; U.S. Pat. No. 5,941,758; and U.S. Pat. No. 5,964,653 and are hereby incorporated by reference. The greater the number of concentric annular bands, the greater the process flexibility in adjusting the carrier 301 to the problems encountered in the planarization process. However, the complexity and cost of the carrier also increases as the number of adjustable bands increases. A carrier with three (3) adjustable concentric pressure bands is expected to give improved process flexibility while keeping the complexity of the carrier to a manageable level. Since the need for improved process results is almost certainly going to increase in the future, the preferred number of controllable bands within the carrier will also likely increase in the future.

Figure 3:
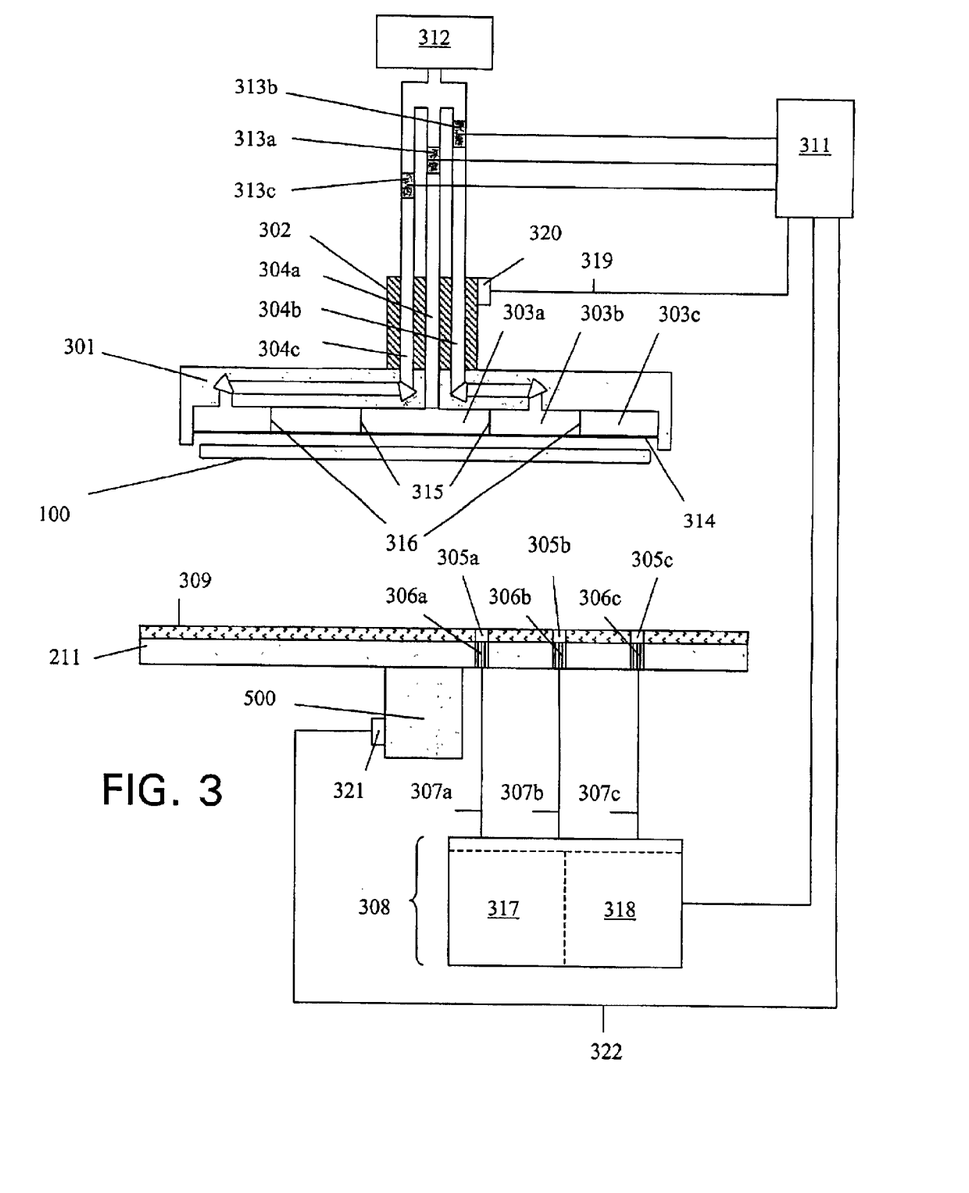
FIG. 3 is a simplified cross section view of an apparatus used to practice the present invention.
Figure 4:
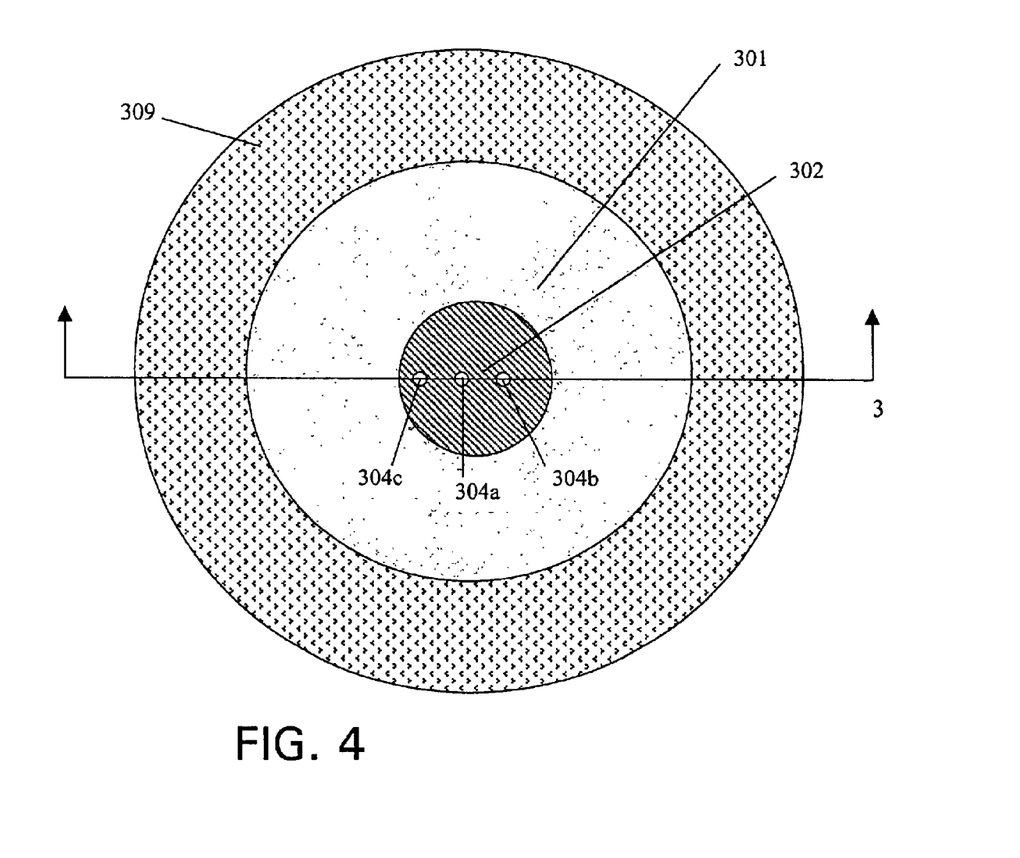
FIG. 4 is a top plan view of FIG. 3.

A simplified view of one possible multizone carrier 301 that may be used with the invention is illustrated in FIGS. 3 and 7. This illustrated carrier 301 has three concentric plenums: a central 303a, intermediate 303b and peripheral 303c plenum. A flexible membrane 314 provides a surface for supporting the wafer 100 while an inner 315 and an outer 316 ring provide barriers for separating the plenums 303a–c. The pressure within the central 303a, intermediate 303b and peripheral 303c plenums may be individually communicated through passageways 304a–c by respective controllable pressure regulators 313a–c connected to a pump 312. A rotary union 302 may be used in communicating the pressure from the pump 312 and pressure regulators 313a–c to their respective plenums 303a–c if the carrier 301 is rotated. A controller 311 may be used to automate the selected pressure for each pressure regulator 313a–c. Thus, each concentric plenum 303a–c may be individually pressurized to create three concentric bands to press against the back surface of the wafer 100. Each plenum 303a–c may therefore have a different pressure, but each concentric band will therefore have a uniform pressure within the band to press against the back surface of the wafer 100.

The invention may be used with a variety of polishing pads 309 that typically comprise a urethane-based material or other abrasive surfaces. Examples of conventional polishing pads 309 that may be used with the invention are an IC1000 or an IC1000 supported by a Suba IV polishing pad. Both of these polishing pads 309 and others are manufactured and made commercially available by Rodel, Inc. with offices in Phoenix, Ariz.

A supporting surface 211 may be used to support the abrasive surface or polishing pad 309. The supporting surface 211 may be a rigid substantially planar surface comprising aluminum, stainless steal, ceramic, titanium, polymer or other such rigid, non-corrosive material. Alternatively, the supporting surface 211 may comprise a diaphragm supported by pressurized fluids alone or in combination with other flexible layers. Both methods are known in the art for providing a supporting surface 211 for a polishing pad 309. A slurry delivery system (not shown) is preferably incorporated into the supporting surface 211 for delivery of slurry onto the polishing pad 309. The polishing pad 309 and supporting surface 211 preferably have a hole or window to allow the communication of a light signal to and from the front surface of the wafer 100.

The supporting surface 211 may be connected to a motion generator 500 for creating relative motion between the front surface of the wafer 100 and the polishing pad 309. Various motions for the supporting surface 211 are already known. For example U.S. Pat. No. 5,498,196 shows an example of a rotational CMP tool; U.S. Pat. No. 5,692,947 shows an example of a linear belt system; U.S. Pat. No. 5,707,274 shows an example of a rotary drum system; and U.S. Pat. No. 5,554,064 shows an example of an orbital tool, all of which are hereby incorporated by reference. However, the supporting surface 211 is preferably moved in an orbital motion in a manner more fully explained below in the description of the motion generator 500.

U.S. Pat. No. 5,582,534 Shendon et al. and U.S. Pat. No. 5,938,884 Hoshizaki et al. disclose several mechanisms for creating an orbital motion for a carrier. The principles for the mechanisms disclosed for creating an orbital motion may be applied by one of ordinary skill in the art to create a motion generator 500 capable of orbiting the supporting surface 211 and polishing pad 309 and are hereby incorporated by reference.

Figure 5:
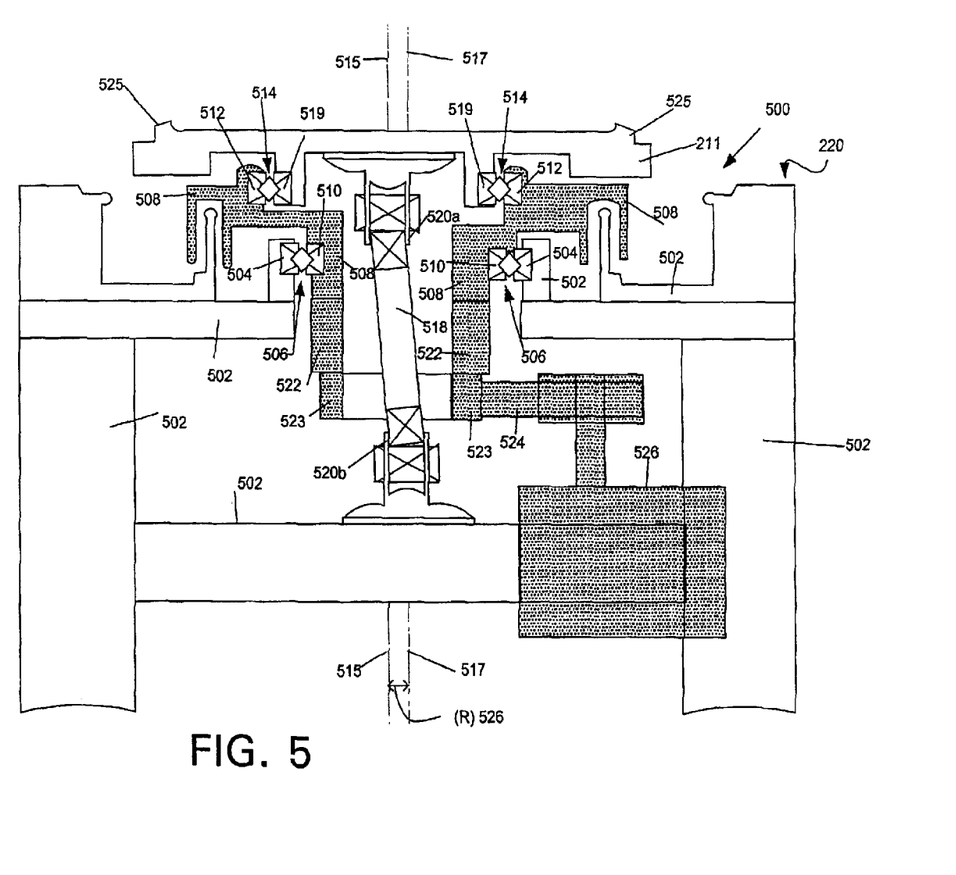
FIG. 5 is a cross section view of an apparatus for producing an orbital motion.

FIG. 5 is a cross-sectional view of an exemplary motion generator 500 that may be used to generate an orbital motion for the supporting surface 211. The motion generator 500 is generally disclosed in U.S. Pat. No. 5,554,064 Breivogel et al. and is hereby incorporated by reference. Supporting base 220 may have a rigid frame 502 that can be securely fixed to the ground. Stationary frame 502 is used to support and balance motion generator 500. The outside ring 504 of a lower bearing 506 is rigidly fixed by clamps to stationary frame 502. Stationary frame 502 prevents outside ring 504 of lower bearing 506 from rotating. Wave generator 508 formed of a circular, hollow rigid stainless steel body is clamped to the inside ring 510 of lower bearing 506. Wave generator 508 is also clamped to outside ring 512 of an upper bearing 514. Wave generator 508 positions upper bearing 514 parallel to lower bearing 506. Wave generator 508 offsets the center axis 515 of upper bearing 514 from the center axis 517 of lower bearing 506. A circular supporting surface 211 is symmetrically positioned and securely fastened to the inner ring 519 of upper bearing 514. A polishing pad or pad assembly can be securely fastened to ridge 525 formed around the outside edge of the upper surface of the supporting surface 211. A universal joint 518 having two pivot points 520a and 520b is securely fastened to stationary frame 502 and to the bottom surface of the supporting surface 211. The lower portion of wave generator 508 is rigidly connected to a hollow and cylindrical drive spool 522 that in turn is connected to a hollow and cylindrical drive pulley 523. Drive pulley 523 is coupled by a belt 524 to a motor 526. Motor 526 may be a variable speed, three phase, two horsepower AC motor.

The orbital motion of supporting surface 211 is generated by spinning wave generator 508. Wave generator 508 is rotated by variable speed motor 526. As wave generator 508 rotates, the center axis 515 of upper bearing 514 orbits about the center axis 517 of lower bearing 506. The radius of the orbit of the upper bearing 517 is equal to the offset 527 between the center axis 515 of upper bearing 514 and the center axis 517 of the lower bearing 506. Upper bearing 514 orbits about the center axis 517 of lower bearing 506 at a rate equal to the rotation of wave generator 508. It is to be noted that the outer ring 512 of upper bearing 514 not only orbits but also rotates (spins) as wave generator 508 rotates. The function of universal joint 518 is to prevent torque from rotating or spinning the supporting surface 211. The dual pivot points 520a and 520b of universal joint 518 allow the supporting surface 211 to move in all directions except a rotational direction. By connecting the supporting surface 211 to the inner ring 519 of upper bearing 514 and by connecting universal joint 518 to the supporting surface 211 and stationary frame 502 the rotational movement of inner ring 519 and supporting surface 211 is prevented and supporting surface 211 only orbits as desired. The orbit rate of supporting surface 211 is equal to the rotation rate of wave generator 508 and the orbit radius of supporting surface 211 is equal to the offset of the center 515 of upper bearing 514 from the center 517 of lower bearing 506. The orbit rate of the supporting surface is preferably about 600 orbits per minute with a preferred orbit radius of less than 16 mm.

It is to be appreciated that a variety of other well-known means may be employed to facilitate the orbital motion of the polishing pad 309. While a particular method for producing an orbital motion has been given in detail, the present invention may be practiced using a variety of techniques for orbiting, rotating, or otherwise moving the polishing pad 309 and supporting surface 211 in relation to the front surface of the wafer 100.

FIG. 3 illustrates a multiprobe metrology instrument 308, e.g. a multiprobe end-point detection system, that may be used to analyze data from the front surface of a wafer. Multiple probes allow samples to be taken at a desired density across the front surface of the wafer 100 in a shorter time than a single probe system, but increase the complexity of the system. Additional probes prevent or shorten the time when there are no probes under the front surface of the wafer 100 and may even allow multiple points to be sampled substantially simultaneously. It is highly desirable to take samples at a desired spatial density across the entire surface of the wafer 100 (a "scan") as quickly as possible to obtain the best possible data to analyze. The surface of the wafer 100 changes rapidly during the planarization process and a long interval between samples will result in the early measurements not accurately reflecting the condition of the wafer 100 when the later measurements are taken. Interpolation, extrapolation or modeling software may be used to make estimates that compensate for temporal variations in samples, but the preferred method is to complete the scan as quickly as possible.

As a specific example, a short scan time may help avoid dishing or erosion in a copper planarization process. Once an area has cleared (copper has been removed down to a barrier layer) a scan of the entire wafer is preferably completed with the desired resolution within the time necessary to prevent excessive erosion or dishing of features in the cleared area. Measurements are most important once an area has cleared to make sure the planarization process stops before that area or any other area experiences erosion or over-polishing.

The multiprobe end-point detection system 308 may be used to determine areas on the front surface of the wafer 100 that need an increase or decrease in material removal rate. The areas that need an increase or decrease in material removal rate will typically take the form of concentric rings about an annular central region on the front surface of the wafer 100.

A multiprobe end-point detection system 308 is advantageous in CMP tools where a wafer does not remain over the same area of a polishing pad, as in a conventional rotational CMP tool. Multiple probes may be used to reduce the amount of time when no probe is under the wafer or may be used to increase the number of points sampled when more than one probe is under the wafer. A multiprobe end-point detection system 308 is also advantageous in systems where the wafer remains substantially over the same area of a polishing pad, as in a conventional orbital system. As illustrated in FIG. 3, the probes 306a–c may be positioned where they are always, or almost always, under the wafer 100 thereby allowing multiple probes 306a–c to take samples substantially continuously. This highly efficient use of the probes 306a–c greatly reduces the time necessary to complete a scan and greatly increases the accuracy of the analysis of the front surface of the wafer 100 by limiting temporal differences in the samples.

Referring still to FIG. 3, an emitter or flash lamp 317 may be used to initiate a light signal to travel through one or more fiber optic cables 307a–c. One or more probes 306a–c may be used to receive and transmit the light signal through one or more holes or transparent areas 305a–c in the polishing pad 309 to the front surface of the wafer 100. The probes 306a–c are preferably positioned as close as possible to a transparent area 305a–c to enhance the optical communication. The reflected light signal from the wafer 100 may be captured by a probe 306a–c and routed to a metrology instrument 318, such as a spectrometer, via fiber optic cables 307a–c. The invention may be practiced with a variety of probes, flash lamps and fiber optic cables that are known in the art.

While measurement averaging or integration over a large area may be used to collect samples, a flash lamp 317 allows high-speed discrete measurements to be taken. Discrete measurements provide finer spatial resolution and are capable of detecting smaller residuals on the front surface of the wafer 100. The light signal may be a broad band spectrum of light so that the intensity of the reflected light signal may be analyzed at multiple wavelengths. The spectrum preferably includes light between 300 and 800 nm in wavelength. As a specific example, a Xe flash lamp 317 may be used to generate the light signal.

The flash duration of the flash lamp 317 should be as short as possible to minimize the amount of relative motion between the surface of the wafer and the flash lamp 317 and probe 306a–c during signal collection. Relative motion between the surface of the wafer 100 and the probe will create a smear effect and decrease the sensitivity of the measurement if the illumination were to endure over the relatively large duty cycle period of a grating spectrometer. The flash duration does need to be long and intense enough, however, to provide enough signal intensity for the probes 306a–c to collect the reflected light from the surface of the wafer 100. The flash duration is preferably less than about three microseconds.

The flash is optimally repeated as quickly as possible in order to gather the greatest amount of sample data. However, two factors limit the usefulness of extremely fast flash rates. The first is that each flash provides a tremendous amount of data that must be quickly analyzed. Data that has been gathered, but that cannot be timely analyzed does not benefit the system. The second factor is that some time must be allowed to pass between measurements in order for relative motion between the front surface of the wafer 100 and the probes 306a–c to move the measurement location. The measurements are preferably evenly distributed, and as close as possible, across the front surface of the wafer 100.

The spot size of light from the flash lamp 317 is preferably slightly larger than the largest copper feature that is supposed to remain on the surface of the wafer 100. This will prevent a fully planarized area from giving a false reading indicating that copper residuals remain. This could happen if a measurement were taken over a large copper feature, such as a bond pad, with a spot size smaller than the bond pad. On the other hand, a spot size that is too big may miss copper residuals that are smaller than the spot size. The optimum spot size is larger than the largest copper feature while also being smaller than the smallest copper residual it is required to detect. As feature sizes continue to decrease and the requirements for semiconductor manufacturing continue to become more stringent, the optimum spot size will decrease. A spot size of one to three mm in diameter is acceptable for most current semiconductor manufacturing requirements with smaller spot sizes likely required in the future.

There are preferably enough probes properly positioned in the CMP tool to allow sampling across the entire front surface of the wafer 100 during the planarization process. Typical orbital CMP tools, due to the small relative movements between the front surface of the wafer 100 and the polishing pad 309, need multiple probes that preferably have a slight overlap of coverage to insure all areas on the front surface of the wafer 100 are sampled. Each probe in a conventional orbital CMP tool, with a rotating carrier 301, will examine an annular band on the front surface of the wafer 100 approximately the width of the diameter of the orbit. Thus, all the data for a particular annular band on the front surface of the wafer 100 in a conventional orbital CMP tool comes from a single probe thereby simplifying the analysis of the data.

The metrology instrument 318, preferably a grating spectrometer(s), accepts the incoming reflected light signal and converts the light signal into data indicating the intensity of the reflected light at a plurality of different wavelengths. The data may then be transmitted to a control system 311 for analysis. The control system 311 is able to determine the condition of the front surface of the wafer 100 from the data. For example, a transition from a copper to a silicon dioxide surface may easily be detected with a broadband probe. The reflected signal itself may have monotonic characteristics when reflected from a metallic layer and sinusoidal characteristics when reflected from an oxide layer (or a nonmetallic layer). Specifically, the reflected signal may become sinusoidal in nature after the metallic layer has been cleared away and the oxide layer becomes the reflective surface.

FIG. 7 illustrates a single laser 701 and interferometer 704 pair that may be used to capture data from the front surface of the wafer 100. Additional lasers and interferometers may be used to increase the data collection capabilities over the single laser 701 and interferometer 704 shown. Additional lasers and interferometers would shorten the time necessary to collect sufficient data to calculate an approximate topography of the front surface of the wafer, but would increase the cost and complexity of the system. The advantages and disadvantages of additional lasers and interferometers are similar to the advantages and disadvantages previously described for the additional probes illustrated in FIG. 3.

Referring to FIG. 7, a laser 701 may be used to initiate a laser beam 702 through a hole or window in the platen 211 and polishing pad 309 towards the front surface of the wafer 100. An interferometer 704 may be used to receive the reflected laser beam 703. The invention may be practiced with a variety of lasers and interferometers that are known in the art. The laser 701 and interferometer 704 may be secured to, and rotate with, the platen 211. The laser 701 may be operated continuously or only when the front surface of the wafer 100 is adjacent the laser 701 and interferometer 704. A control system 311, such as a general purpose programmable computer, may be in communication with the laser 701, interferometer 704, carrier encoder 320 and motion generator encoder 321. The control system 311 may be programmed to activate the laser 701 when the wafer 100 is adjacent to the laser 701 and interferometer 704. As the laser beam 702 sweeps across the front surface of the wafer 100, the laser interferometer 704 integrates the measured intensity over a sampling period to generate a series of individual intensity measurements.

The control system 311 may store the intensity measurements from the interferometer 704 to calculate the initial thickness, polishing rate, amount removed and/or remaining thickness from the intensity measurements, and to detect the polishing endpoint. Intensity measurements may be taken at a plurality of locations or radial locations. The control system 311 may use the intensity measurements and their corresponding locations to calculate an approximate topography of the front surface of the wafer. An approximate topography for the front surface of the wafer may be calculated even if only the radial positions of the intensity measurements are known since wafers generally polish in uniform concentric bands. The laser interferometer 704 may have a sample rate between about 5 and 750 Hertz and preferably about 40 Hertz. The measurements are preferably evenly distributed, and as close as possible, across the front surface of the wafer 100.

The interferometer 704 accepts the incoming reflected laser beam 703 and converts the reflected laser beam 703 into an intensity measurement. The reflected laser beam 703 comprises light reflected from the front surface of the wafer and light reflected from various other thin film layers previously deposited on the wafer. The reflected lights interfere with each other constructively or destructively depending on their phase relationship to form the reflected laser beam 703. The phase relationship of the reflected light is primarily a function of the index of refraction and thickness of the thin film layers, the wavelength of the laser beam 702 and the angle of incidence of the laser beam 702. The thickness of the thin film layers may be calculated since the index of refraction, wavelength of the laser beam 702 and angle of incidence may be determined. A method of analyzing the front surface of a wafer with a laser and interferometer is described by U.S. Pat. No. 6,159,073 which is hereby incorporated.

A number of numerical methods may be used to determine when the planarization process should be terminated, i.e. end-point called for single or multiple frequency systems or single or multple probe systems. For example, end-point may be called after a predetermined over-polish time has occurred starting from the time a predetermined percentage of measurements show an absence of copper. The over-polish time insures a complete clearing of the copper. The over-polish time and the percentage of measurements showing an absence of copper are preferably determined empirically due to variations from planarization process to planarization process.

Another method of analyzing the data compares the measurements taken with previously determined polish-time curves. This allows the time remaining prior to calling endpoint to be calculated. Each new wafer planarized may be used to update and further refine the polish-time curves.

Another method of analyzing the data compares the clearing time for different concentric areas on the front surface of the wafer 100. This method may be simplified when each probe or laser interferometer monitors a particular, possibly overlapping, concentric band as would be the case when this invention is used with orbital CMP tools with a relatively small orbital radius. For example, in FIG. 3 probes 306a–c below areas that clear first indicate bands that are being polished too quickly in comparison to other bands. Corrective action may then be taken for that wafer 100 or the information may be used to improve the planarization process for incoming wafers.

The control system 311 may make immediate adjustments to the planarization process based on the analysis of the measurements. For example, increasing or decreasing the pressure on the back surface of the wafer 100 during the planarization process has been found to increase or decrease, respectively, the removal rate at the periphery of the wafer 100 with respect to the center of the wafer 100. As another example, more or less slurry may be distributed near areas that have been found to need increased or decreased, respectively, removal rates. As yet another example, the rotation speed of the carrier 301 may be increased or decreased to increase or decrease, respectively, the removal rate at the periphery of the wafer 100. However, the preferred method is to use a multizone carrier 301 to alter the removal rate at different areas of the front surface of the wafer 100. Specifically, the pressure may be increased or decreased in zones over areas that need an increase or decrease in material removal rate, respectively, on the front surface of the wafer 100. In addition, the results from planarized wafers 100 may be used to change the process parameters for incoming wafers. This allows process drift within the planarization process to be detected and compensated for as it happens.

The probes, fiber optic cables, flash lamps and spectrometer that may be used in practicing the invention are well known and may be purchased from Verity Instruments, Inc. headquartered in Dallas, Tex.

To determine the condition of the front surface of the wafer 100, the location for each measurement should be known. One possible method is to track only the radial position for each measurement and take at least one measurement at various radial positions in fine enough increments to provide a desired sampling resolution. This method assumes that each measurement accurately represents the condition of the wafer 100 at every point having the same radial position. Since wafers 100 generally have bands that planarize at approximately the same rate, this method provides a simple approximation of the condition of the front surface of the wafer 100. However, this method may miss areas that do not follow the normal band pattern. The preferred method is to track the position of each measurement in two axes on the front surface of the wafer 100. In this manner, measurements may be taken across the front surface of the wafer 100 at a desired spatial resolution that prevents a problem area larger than the desired resolution from going unobserved.

Various devices may be used to track the location of the measurement on the front surface of the wafer 100. For example, an encoder 320 may be used to track the position of the carrier 301 (and thus the wafer) and transmit this information via communication line 319 to the control system 311. In a similar manner, an encoder 321 may be used to track the position of the supporting surface 211 (and thus the probes) and transmit this information via communication line 322 to the control system 311. The wafer 100 may need to be firmly held in the carrier 301 to prevent the wafer 100 from spinning and randomizing is orientation. For example, the wafer 100 may be held in place by applying suction to the back surface of the wafer 100 through the membrane 314 or by creating a tacky bottom surface for the membrane 314. The control system 311 thus has the information necessary to match the data from the metrology instrument 318, preferably a spectrometer, with the data's corresponding location on the front surface of the wafer 100.

Modeling software for the mechanical mechanisms that cause the relative motion between the wafer 100 and the polishing pad 309 may also be used to predict the location of each measurement on the front surface of the wafer 100. Modeling software is also useful in determining desirable motions for the carrier 301 and supporting surface 211, and thus the wafer 100 and probes, that will produce a pattern of measurements as evenly distributed as possible. Small adjustments to the desired relative motion between the wafer 100 and the polishing pad 309 may be made to improve the distribution of measurements while having only a minimum impact on the planarization process. An evenly distributed pattern may shorten the time of a scan by requiring the minimum number of measurements and the least amount of data processing. However, the measurement locations do not have to be evenly distributed, but the largest space between measurements is preferably smaller than the targeted residual detection capability.

Other methods for determining the radial location of measurements taken may also be used. For example, U.S. Pat. No. 6,159,073 describes several different methods for determining the radial location of a measurement with a laser and interferometer on a rotational polishing pad and is hereby incorporated by reference.

FIG. 7 illustrates a portion of a polishing pad 309 that may be rotated about an axis A700. The rotation of the polishing pad 309 causes the laser beam 702 from the laser 701 to sweep across the bottom surface of the wafer 100. The interferometer 704 is thus able to gather data along the sweep path on the front surface of the wafer 100. A first spike (T1) occurs in the data at the time when the laser beam 702 passes under the leading edge and a second spike (T2) occurs when the laser beam 702 passes under the trailing edge of the wafer 100. The spikes T1 and T2 thus bracket the data from the front surface of the wafer 100. The data may be divided into a plurality of different sections, preferably between three and fifteen, where each section of data comes from approximately the same radial position. A mid-line position may be found by averaging times T1 and T2. By determining the time difference between the mid-line position and the various sections of data and by knowing the rotational speed of the platen 211, the radial position for each of the section of data may be determined. Increased accuracy may be achieved by averaging together various sections of data from different sweeps that are from the same radial position on the wafer 100. In this manner the topography, thin film thickness or clearing uniformity may be calculated for the front surface of the wafer 100. It should be understood that although the above described technique for resolving the spacial orientation of the data for a rotational platen apparatus was described in terms of a laser interferometer, it is not limited to laser systems. In fact the technique is applicable regardless as to the choice of probe and signal analysis hardware and software used. For example the probe may be a broadband fiber-optic system of the type previously described, a capacitance system, eddy current system, or any known system for interrogating the surface of the wafer.

The measurements may also be analyzed until the largest possible remaining residual is of a predetermined size. Once all the remaining residuals are of the predetermined size or smaller, the wafer 100 may be planarization for an additional time (over-polish time) to remove the remaining residuals. The additional planarization time may be found by empirically determining the maximum amount of time necessary to planarize away residuals of the predetermined size.

Figure 6:
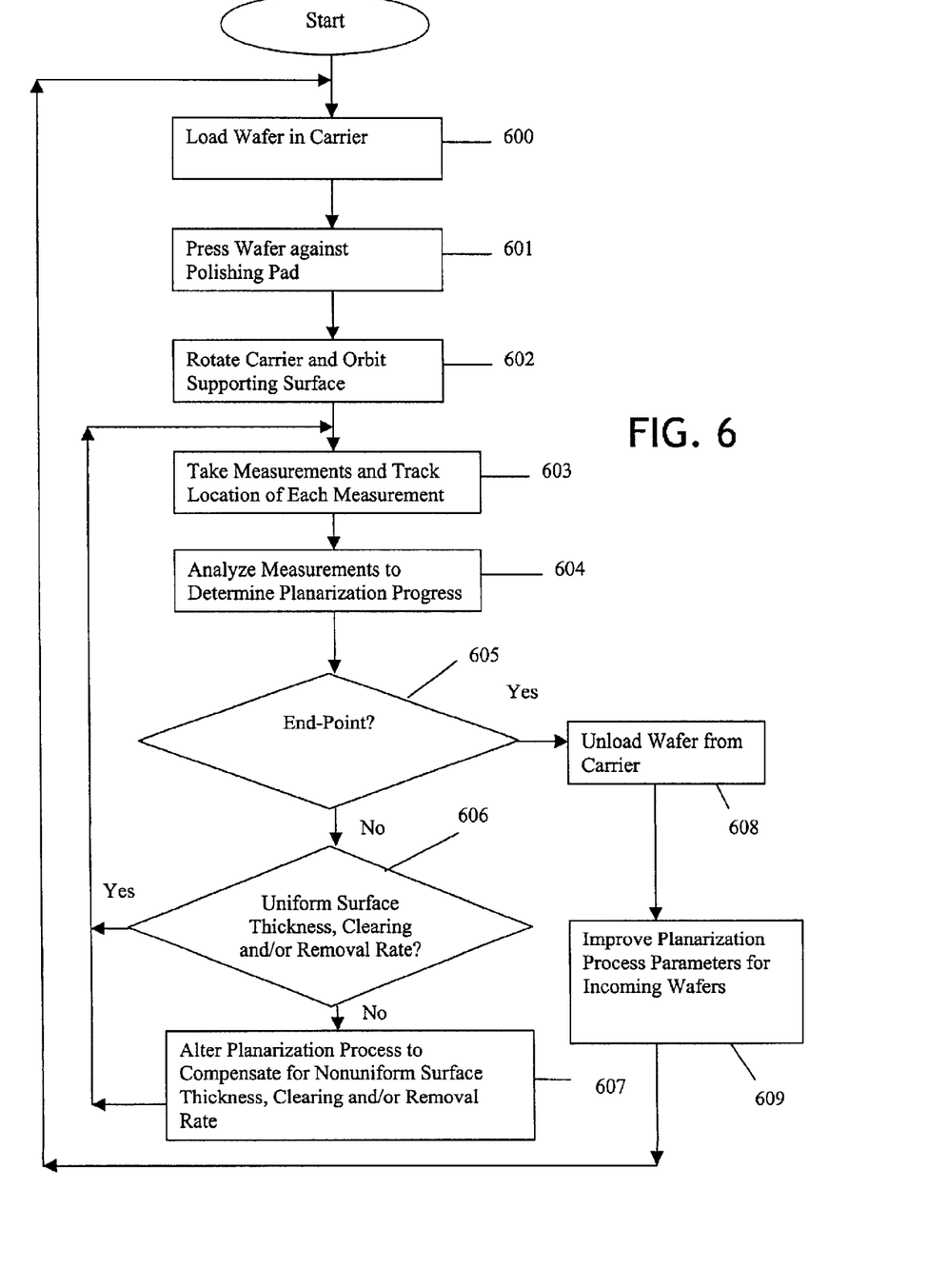
FIG. 6 is a flow diagram of an exemplary process for practicing the present invention.

An illustrative method for planarizing a front surface of a wafer 100 will now be described with reference to FIGS. 3 and 6. The wafer 100 is placed in a carrier 301 (step 600) and transported adjacent a polishing pad 309. The carrier 301 holds the wafer 100 substantially parallel to the polishing pad 309 while the wafer 100 is pressed against the top surface of the polishing pad 309 (step 601). The carrier 301 may be rotated or otherwise moved in relation to the polishing pad 309 to assist in uniformly removing material from the front surface of the wafer 100. The supporting surface 211 and attached polishing pad 309 may also be moved in relation to the front surface of the wafer 100 and is preferably orbited. (step 602) The relative motion is necessary to remove material from the front surface of the wafer 100.

An end-point system 308 with two or more probes 306a–c may be used to take measurements across the front surface of the wafer 100 during the planarization process. The end-point system 308 may reflect a light signal off the front surface of the wafer 100 using a flash lamp 317. A spectrometer 318 may be used to convert the reflected light into data representing the intensity of the reflected light at a plurality of wavelengths. Linear encoders 320 and 321, computer modeling or other known methods for determining the physical location of the mechanical devices may be used to track the location of the carrier 301 and the supporting surface 211. This allows the location on the front surface of the wafer 100 to be determined for each measurement (step 603). A control system 311 may be used to analyze the measurements from the spectrometer 318 and the location of the measurements on the wafer 100 to determine the progress of the planarization process and the condition of the wafer 100 (step 604). If the wafer 100 has been sufficiently planarized, the planarization process may be terminated (step 605). The control system 311 may also be used to determine if an increased or decreased removal rate over a portion of the front surface of the wafer 100 is desirable (step 606). If the wafer 100 is being uniformly planarized, further measurements may be taken and analyzed (back to step 603). However, if the control system 311 determines the removal rate should be increased or decreased in particular areas, one or more planarization process parameters may be altered. For example, the down-force, slurry delivery profile, rotation speed of carrier, etc. may be adjusted to improve the planarization process. If a multizone carrier 301 is being used, an increased or decreased pressure may be exerted on the back surface of the wafer 100 opposite areas on the front surface of the wafer 100 that require an increased or decreased removal rate respectively (step 607). After altering the planarization process, farther measurements may be taken and analyzed (back to step 603) with appropriate steps as described above taken. If the control system 311 determines the wafer 100 has been sufficiently planarized (step 605) the wafer may be unloaded from the carrier (step 608) and removed from the CMP tool. The planarization results for this wafer 100 may be used to determine an improved planarization process for incoming wafers (step 609). This allows an improved down-force, slurry delivery profile, rotation speed of carrier, pressures within multizone carrier, relative motions between wafer 100 and polishing pad 309, etc. to be altered during the planarization process for incoming wafers to further improve the planarization process.

Figure 8:
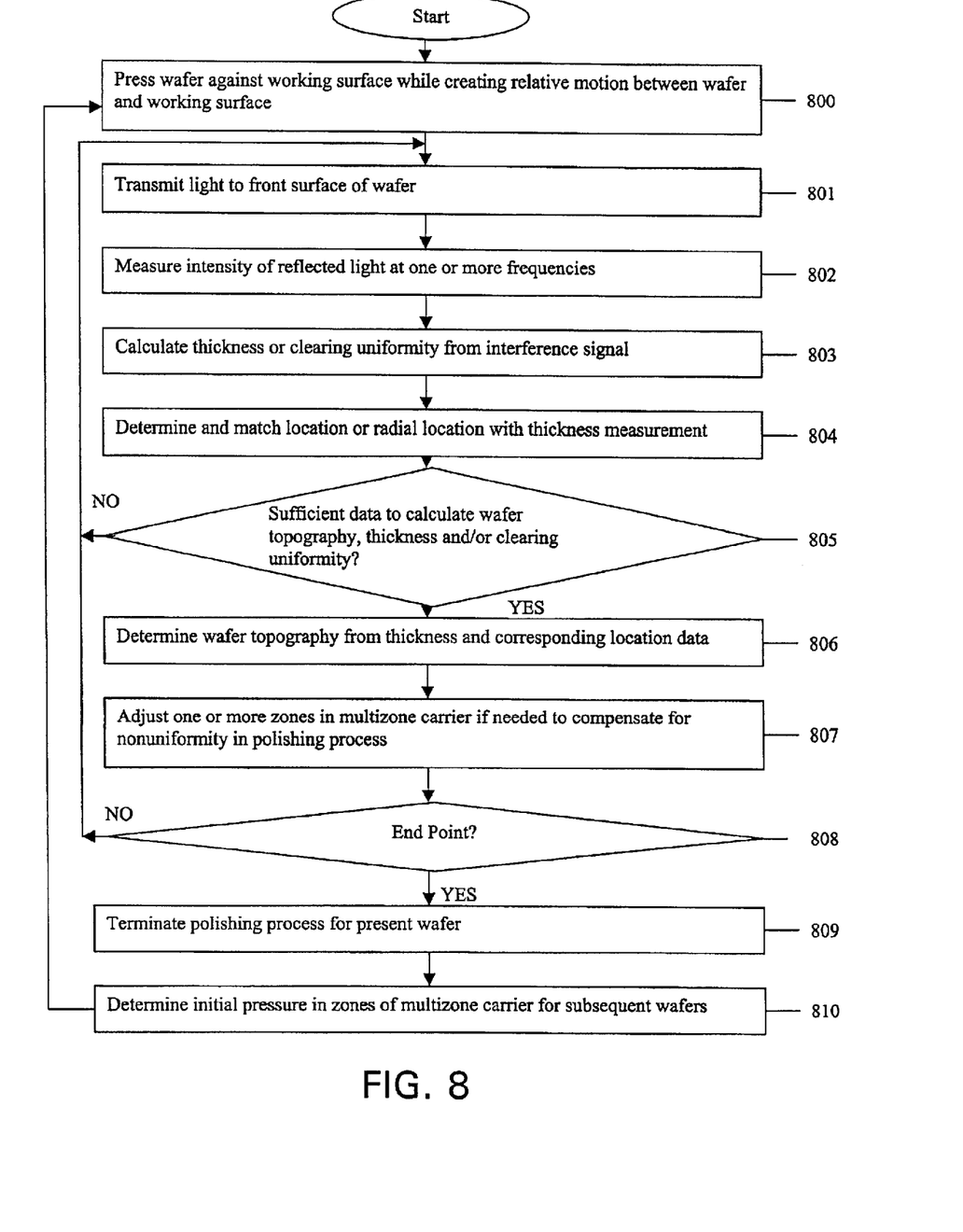
FIG. 8 is a flow diagram of an exemplary process for practicing the present invention.

Another method for planarizing a front surface of a wafer 100 will now be described with reference to FIGS. 7 and 8. The wafer 100 is placed in a carrier 301 and transported adjacent a polishing pad 309. The carrier 301 holds the wafer 100 substantially parallel to the polishing pad 309 while the wafer 100 is pressed against the top surface of the polishing pad 309. The carrier 301 may be rotated or otherwise moved in relation to the polishing pad 309 to assist in uniformly removing material from the front surface of the wafer 100. The supporting surface 211 and attached polishing pad 309 may also be moved in relation to the front surface of the wafer 100 and is preferably rotated about axis A700. (step 900) The relative motion is necessary to remove material from the front surface of the wafer 100.

A laser 701 and interferometer 704 may be used may be used to take measurements across the front surface of the wafer 100 during the planarization process. The laser 701 transmits a laser beam 702 through a hole or window in the platen 211 and polishing pad 309 to the front surface of the wafer 100. (step 901) The laser 701 may continuously transmit a laser beam 702 or a control system 311 may be used to transmit the laser beam 702 only during a desired measurement cycle. The intensity of the reflected laser beam 703 will vary depending on the thickness of the thin film layers due to the constructive or destructive phase relationships of the reflected laser beam 703. The intensity of the reflected laser beam 703 may be measured by a laser interferometer 704. (step 902) The thickness of the thin film (or other characteristics of the thin film) may be determined from the intensity of the reflected laser beam 703. (step 903) Again in this case, alternative systems to the described laser and interferometer may be used to interrogate the surface of the wafer, such as broadband optical, eddy current, and the like.

Linear encoders 320 and 321, computer modeling or other known methods for determining the physical location of the mechanical devices may be used to track the location of the carrier 301 and the supporting surface 211. This allows the location on the front surface of the wafer 100 to be determined for each measurement (step 904). Alternatively, just the radial locations of the measurements may be determined since wafers tend to polish at approximately the same rate at any given radial location. All the measurements within a particular radial band may be grouped together to determine the thickness of the thin film at that radial band. By taking measurements in various radial locations, the thickness of the thin film at various radial bands may be determined. Once a sufficient number of measurements have been taken, the control system 311 may be used to analyze the measurements and their corresponding locations. (steps 905 & 906) The wafer topography or the thickness at various radial locations may be determined by the control system 311 to determine the progress of the planarization process.

The control system 311 may be used to determine if an increase or decrease in the removal rate over a portion of the front surface of the wafer 100 is desirable. If the wafer 100 is being uniformly planarized, further measurements may be taken and analyzed. However, if the control system 311 determines the removal rate should be increased or decreased in particular areas, one or more planarization process parameters may be altered. For example, the downforce, slurry delivery profile, rotation speed of carrier, etc. may be adjusted to improve the planarization process. If a multizone carrier 301 is being used, an increase or decrease in the pressure may be exerted on the back surface of the wafer 100 opposite areas on the front surface of the wafer 100 that require an increase or decrease in removal rates respectively. (step 907). After altering the planarization process, further measurements may be taken and analyzed with appropriate steps as described above taken. If the control system 311 determines the wafer 100 has been sufficiently planarized (step 908) the wafer may be unloaded from the carrier (step 909) and removed from the CMP tool. The planarization results for this wafer 100 may be used to determine an improved planarization process for incoming, or subsequent wafers (step 910). The improved planarization process may be realized by preferentially adjusting certain polishing parameters for the subsequent wafers, such as down-force, slurry delivery profile, rotation speed of carrier, pressures within multizone carrier, and relative motions between wafer 100 and polishing pad 309. For example, if the planarization results indicate that the outer portion of the wafer is polishing faster than the central portion of the wafer, adjustments can be made to the carrier to even out the polishing rate across the entire wafer for subsequently polished wafers. In that case, it may be advantageous to re-adjust the zonal pressures in the multizone carrier to reduce the pressure on the outer portion of the wafer relative to the center portion. For example, referring to FIG. 7, the pressure in zone 303c could be reduced, while the pressure in zone 303a could be increased for subsequent wafers. Those skilled in the art will recognize that various other combinations of modified carrier pressures or modified polishing parameters may be appropriate for subsequent wafers, depending on the measured planarization results and the particular type of polishing process.

While the invention has been described with regard to specific embodiments, those skilled in the art will recognize that changes can be made in form and detail without departing from the spirit and scope of the invention. For example, while a single probe laser interferometer with a rotational polishing pad system and a multiprobe multifrequency orbital polishing pad system were both described, various combinations of number of probes, types of light and types of motions for the polishing pad may be used.

We claim:

1. An apparatus used in planarizing a wafer having a front surface, a leading edge, and a trailing edge, the apparatus comprising:
   a polishing pad having polishing surface;
   a platen adapted to support the polishing pad;
   a motion generator operably coupled to rotate the platen;
   an interferometer, comprising a light source positioned to sweep a light signal entirely across the wafer front surface from the wafer leading edge to the wafer trailing edge due to rotation of the platen, and a detector positioned to capture the light signal after reflecting off the wafer from surface;
   a multizone carrier adapted for pressing the front surface of the wafer against the polishing surface, said carrier comprising a plurality of concentric, independently pressurizable plenums, each of said plurality of plenums capable of containing a different, uniform pressure;
   a control system in communication with the interferometer and the multizone carrier for varying the pressure in each of said plurality of plenums.

2. The apparatus of claim 1, wherein the interferometer further comprises a detector positioned to capture the light signal incident on the front surface of a wafer.

3. An apparatus used in planarizing a wafer having a front surface, a leading edge, and a trailing edge, the apparatus comprising:
   a platen for supporting a polishing surface;
   a motion generator operably coupled to rotate the platen;
   a light source positioned in the platen and operable to sweep a light signal entirely across the wafer front surface from the wafer leading edge to the wafer trailing edge due to rotation of the platen;
   a multizone carrier having a plurality of concentric, independently controllable pressure plenums, wherein the carrier is adapted for pressing the front surface of the wafer against the polishing surface; and
   a control system in communication with the light source, the detector and the multizone carrier for adjusting the pressure in each of said plurality of concentric, independently controllable pressure plenums.

4. The apparatus of claim 3, wherein the light source comprises a laser and the detector comprises an interferometer.

5. An apparatus used in planarizing a wafer having a front surface, a leading edge, and trailing edge, the apparatus comprising:
   a polishing pad having a polishing surface;
   a platen adapted to support the polishing pad;
   a motion generator operably coupled to rotate the platen;
   a temperature probe positioned to sweep entirely across the wafer front surface from the wafer leading edge to the wafer trailing edge due to rotation of the platen, and configured for monitoring the front surface of a wafer;
   a multizone carrier having a plurality of concentric, independently controllable pressure plenums, wherein the carrier is adapted for pressing the front surface of the wafer against the polishing surface; and
   a control system in communication with the temperature probe and the multizone carrier for adjusting the pressure in each of the independently controllable pressure plenums.

6. An apparatus used in planarizing a wafer having a front surface, a leading edge, and a trailing edge, the apparatus comprising:
   a polishing pad having a polishing surface;
   a platen adapted to support the polishing pad;
   a motion generator operably coupled to rotate the platen;
   an eddy current probe positioned to sweep entirely across the wafer front surface from the wafer leading edge to the wafer trailing edge due to rotation of the platen, and configured for monitoring a front surface of wafer;
   a multizone carrier having a plurality of concentric, independently controllable pressure plenums, wherein the carrier is adapted for pressing the front surface of the wafer against a polishing surface; and
   a control system in communication with the eddy current probe and the multizone carrier for adjusting the pressure in each of said independently controllable pressure plenums.

7. A method for planarizing a front surface of a wafer having a front surface, a leading edge, and a trailing edge, the method comprising the steps of:

a) continuously pressing a front surface of a wafer mounted in a multizone carrier against a working surface during a planarization process, the multizone carrier comprising a plurality of concentric, independently pressurizable plenums;

b) continuously rotating the working surface and thereby generating relative motion between the front surface of the wafer and the working surface during the planarization process;

c) sweeping a light signal entirely across the front surface of the wafer from the wafer leading edge to the wafer trailing edge due to rotation of the working surface;

e) receiving an interference signal from the front surface of the wafer;

f) correlating intensity measurements with radial positions on the front surface of the wafer;

g) analyzing the intensity measurements and the correlated radial positions;

h) adjusting the pressure in at least one of said plurality of plenums based on the analysis.

8. The method of claim 7, further comprising the steps of: repeating steps c) through h) until an endpoint condition has been detected.

9. A method for planarizing a front surface of a wafer in a chemical mechanical polishing tool with a rotating working surface and a multizone carrier for holding the wafer and pressing it against working surface, comprising the steps of:

a) polishing a first wafer by continuously pressing a front surface of the wafer against the rotating working surface using a first set of carrier zone pressures;

b) transmitting a plurality of sequential light to the front surface of the first wafer;

c) receiving a plurality of reflected light signals from the front surface of the first wafer corresponding to the transmitted light signals;

d) correlating the reflected light signals with radial positions on the front surface of the first wafer;

e) determining a planarization condition of the front surface of the first wafer based on the reflected light signals and the radial positions thereof;

f) adjusting the multizone carrier to a second set of carrier zone pressures based on the planarization condition of the first wafer;

g) polishing a second wafer using the second set of carrier zone pressures;

h) identifying a radial region of the wafer that was overpolished relative to other regions of the wafer; and i) adjusting the carrier zone pressures such that the lowest carrier pressure is substantially adjacent to the overpolished region of the wafer.

10. The method of claim 9 wherein the light signals in the step of transmitting a plurality of light signals are laser light signal.

11. The method of claim 10 wherein the interferometer is used in step (c) for receiving the reflected light signals.

12. The method of claim 7, wherein the step (f) of correlating intensity measurements with radial positions on the front surface of the wafer comprising:

correlating intensity measurements with a mid-line position on the wafer by averaging times T1 and T2, wherein T1 is a time at which a first intensity measurement spike is produced corresponding to the wafer leading edge, and T2 in a time at which a second intensity measurement spike is produced corresponding to the wafer trailing edge.

13. The method of claim 12, wherein the step (f) of correlating intensity measurements with radial positions in the front surface of the wafer further comprising:

dividing the intensity measurements into a plurality of sections, each section corresponding to a time range taking place when the light signal is sweep entirely across the wafer front surface;

calculating a time difference between the times corresponding to the mid-line position on the wafer and to each section; and correlating each section with a radial position on the wafer using the calculated time differences and the working surface rotational speed.

14. The method of claim 13, wherein the step (f) of correlating intensity measurements with radial positions on the front surface of the wafer further comprises:

averaging intensity measurements for a section of data from a plurality of light signal sweeps across the wafer front surface.

15. The apparatus of claim 1, wherein the control system is configured to correlate intensity measurements from the captured light signal with radial positions on the wafer front surface.

16. The apparatus of claim 15, wherein the control system is further configured to correlate intensity measurements with a mid-line position on the wafer by averaging times T1 and T2, wherein T1 is a time at which a first intensity measurement spike is produced corresponding to the wafer leading edge, and T2 is a time at which a second intensity measurement spike is produced corresponding to the wafer trailing edge.

17. The apparatus of claim 16, wherein the control system is further configured to:

divide the intensity measurements into a plurality of sections, each section corresponding to a time range taking place when the light signal is swept entirely across the wafer front surface;

calculate a time difference between the times corresponding to the calculated time differences and the working surface rotational speed.

18. The apparatus of claim 17, wherein the control system is further configured to average intensity measurements for a section of data from a plurality of light sweeps across the wafer front surface.

19. The apparatus of claim 3, wherein the control system is configured to correlate intensity measurements from the captured light signal with radial positions on the wafer front surface.

20. The apparatus of claim 19, wherein the control system is further configured to correlate intensity measurements with a mid-line position on the wafer by averaging times T1 and T2, wherein T1 is a time at which a first intensity measurement spike is produced corresponding to the wafer leading edge, and T2 is a time at which a second intensity measurement spike is produced corresponding to the wafer trailing edge.

21. The apparatus of claim 20, wherein the control system is further configured to:

divide the intensity measurements into a plurality of sections, each section corresponding to a time range taking place when the light signal is swept entirely across the wafer front surface;

calculate a time difference between the times corresponding to the mid-line position on the wafer and to each section; and correlate each section with a radial position on the wafer using the calculated time differences and the working surface rotational speed.

22. The apparatus of claim 21, wherein the control system is further configured to average intensity measurements for a section of data from a plurality of light signal sweeps across the wafer front surface.

* * * * *